(12) United States Patent  (10) Patent No.: US 8,847,588 B2
Tamura  (45) Date of Patent: Sep. 30, 2014

(54) CURRENT SENSOR

(71) Applicant: Alps Green Devices Co., Ltd., Tokyo (JP)

(72) Inventor: Manabu Tamura, Niigata-ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 205 days.

(21) Appl. No.: 13/659,723

(22) Filed: Oct. 24, 2012

(65) Prior Publication Data
US 2013/0162245 A1 Jun. 27, 2013

(30) Foreign Application Priority Data

Dec. 27, 2011 (JP) .................................. 2011-286035

(51) Int. Cl.
*G01R 33/12* (2006.01)
*G01R 33/07* (2006.01)
*G01R 33/09* (2006.01)

(52) U.S. Cl.
USPC .................... 324/244; 324/117 R; 324/117 H

(58) Field of Classification Search
USPC .................................. 324/244, 117 H, 117 R
See application file for complete search history.

(56) References Cited

U.S. PATENT DOCUMENTS 6,512,359 B1    1/2003   Tamai et al.

*Primary Examiner* — Reena Aurora
(74) *Attorney, Agent, or Firm* — Beyer Law Group LLP

(57) ABSTRACT

A current sensor includes a current path to be measured, a neighboring current path that is provided in the vicinity of the current path to be measured, first and second magnetoelectric transducers having a main sensitivity axis parallel to a direction of a magnetic field generated by a current to be measured flowing in the current path to be measured, and are provided so that the directions of the magnetic fields generated by the current to be measured are applied in mutually opposite directions, and third and fourth magnetoelectric transducers having a main sensitivity axis being non-orthogonal to a direction of a magnetic field generated by the neighboring current while being orthogonal to the direction of the magnetic field generated by the current to be measured, and are provided so that the directions of the magnetic fields generated by the current to be measured are applied in mutually opposite directions.

15 Claims, 7 Drawing Sheets

CURRENT SENSOR

CLAIM OF PRIORITY

This application claims benefit of Japanese Patent Application No. 2011-286035 filed on Dec. 27, 2011, which is hereby incorporated by reference.

BACKGROUND OF THE INVENTION

1. Field of the Invention

The present invention relates to a current sensor that measures a current flowing in a conductor while eliminating the influence of a disturbance magnetic field.

2. Description of the Related Art

Since a relatively large current is handled in a motor driving technology field such as in an electric vehicle, a hybrid car, or the like, there is a demand for a current sensor capable of measuring such a large current without contact. Such a current sensor is mounted in, for example, a three-phase motor having three current paths which are arranged in parallel with each other. In the current sensor mounted in such a three-phase motor, it is necessary to prevent deterioration of measurement accuracy of a current to be measured by suppressing the influence of a magnetic field generated by a neighboring current flowing in a neighboring current path that is disposed adjacent to a current path to be measured.

As such a current sensor, there has been proposed a current sensor that may eliminate the influence of a disturbance magnetic field by performing a differential processing with respect to output signals of two magnetic sensing elements. For example, in a current sensor of U.S. Pat. No. 6,512,359, a through-hole is formed in a middle portion of a current path to thereby enable a current to be separated into two of first and second current paths, a first Hall element for detecting a disturbance magnetic field is provided in the through-hole, and a second Hall element for measuring a current (for detecting a signal) is provided outside the first current path and the second current path. In this case, magnetic fields of the first and second current paths offset each other in the first Hall element provided in the through-hole, and therefore the first Hall element outputs an electric signal corresponding to the intensity of the disturbance magnetic field. Therefore, by performing a differential process with respect to an output signal of a first magnetic sensing element and an output signal of a second magnetic sensing element, it is possible to measure a current value flowing through the current path while eliminating the influence of the disturbance magnetic field.

However, in the above-described current sensor, in a case in which the disturbance magnetic fields in different directions are applied to the first Hall element for detecting the disturbance magnetic field and the second Hall element for measuring a current, a current cannot be accurately measured. In particular, in a case in which a neighboring current path that is disposed adjacent to a current path to be measured exists, due to the influence of the neighboring current path, a current value of the current path to be measured cannot be accurately measured. In addition, in a case in which a large current flows in the current path to be measured, it is necessary to form a wide current path, but in a case in which the wide current path is formed, it is difficult to transform the current path (to separate the current path into two).

SUMMARY OF THE INVENTION

The present invention provides a current sensor that may reduce the influence of a magnetic field generated by a current flowing in a neighboring current path which is provided in the vicinity of a current path to be measured, and accurately measure a current value of the current path to be measured.

According to an embodiment of the present invention, there is provided a current sensor including: a current path to be measured; a neighboring current path configured to be provided in the vicinity of the current path to be measured; a first magnetoelectric transducer and a second magnetoelectric transducer each configured to have a main sensitivity axis parallel to a direction of a magnetic field generated by a current to be measured flowing in the current path to be measured, and configured to be provided so that the directions of the magnetic fields generated by the current to be measured are applied in mutually opposite directions; and a third magnetoelectric transducer and a fourth magnetoelectric transducer each configured to have a main sensitivity axis that is non-orthogonal to a direction of a magnetic field generated by the neighboring current while being orthogonal to the direction of the magnetic field generated by the current to be measured, and configured to be provided so that the directions of the magnetic fields generated by the current to be measured are applied in mutually opposite directions.

In the current sensor according to an embodiment of the invention, the first magnetoelectric transducer and the second magnetoelectric transducer may be provided in such a manner that the magnetic field with the same intensity is applied from the neighboring current, and the third magnetoelectric transducer and the fourth magnetoelectric transducer may be provided in such a manner that the magnetic field with the same intensity is applied from the neighboring current.

The current sensor according to an embodiment of the invention may further include an arithmetic processing unit configured to perform an arithmetic process based on output signals of the first magnetoelectric transducer to the fourth magnetoelectric transducer. Here, the arithmetic processing unit may calculate a first differential arithmetic value by performing a differential arithmetic operation on output signals of the first magnetoelectric transducer and the second magnetoelectric transducer, calculate a second differential arithmetic value by performing a differential arithmetic operation on output signals of the third magnetoelectric transducer and the fourth magnetoelectric transducer, and calculate the current to be measured using the first differential arithmetic value and the second differential arithmetic value.

In the current sensor according to an embodiment of the invention, the current path to be measured may be a flat plate having a rectangular cross-sectional shape including a first long side and a second long side parallel to each other as a cross-sectional shape, and wherein the first magnetoelectric transducer and the third magnetoelectric transducer may be provided on a side of the first long side and the second magnetoelectric transducer and the fourth magnetoelectric transducer may be provided on a side of the second long side.

In the current sensor according to an embodiment of the invention, the first magnetoelectric transducer and the third magnetoelectric transducer may be provided in a middle portion of the first long side, and the second magnetoelectric transducer and the fourth magnetoelectric transducer may be provided in a middle portion of the second long side.

In the current sensor according to an embodiment of the invention, the neighboring current path may be a flat plate having a rectangular cross-sectional shape including a third long side and a fourth long side parallel to each other as a cross-sectional shape, and wherein the current path to be measured and the neighboring current path may be provided on the same plane parallel to the first long side to the fourth long side.

In the current sensor according to an embodiment of the invention, the first magnetoelectric transducer and the third magnetoelectric transducer may be in contact with each other, and the second magnetoelectric transducer and the fourth magnetoelectric transducer may be in contact with each other.

In the current sensor according to an embodiment of the invention, the first magnetoelectric transducer and the third magnetoelectric transducer may be arranged to be displaced in a direction of flow of the current to be measured, and the second magnetoelectric transducer and the fourth magnetoelectric transducer may be arranged to be displaced in the direction of flow of the current to be measured.

In the current sensor according to an embodiment of the invention, the first magnetoelectric transducer to the fourth magnetoelectric transducer may have the same characteristics.

In the current sensor according to an embodiment of the invention, the first magnetoelectric transducer to the fourth magnetoelectric transducer may have a sub sensitivity axis having the highest sensitivity in a direction orthogonal to the main sensitivity axis, and wherein a sensitivity direction of the sub sensitivity axis of the first magnetoelectric transducer and a sensitivity direction of a sub sensitivity axis of the second magnetoelectric transducer may be the same and the sensitivity direction of the sub sensitivity axis of the second magnetoelectric transducer and a sensitivity direction of the sub sensitivity axis of the fourth magnetoelectric transducer may be opposite to each other.

In the current sensor according to an embodiment of the invention, the sub sensitivity axis of the first magnetoelectric transducer and the sub sensitivity axis of the second magnetoelectric transducer may be parallel to the main sensitivity axis of the third magnetoelectric transducer and the main sensitivity axis of the fourth magnetoelectric transducer, and wherein the sub sensitivity axis of the third magnetoelectric transducer and the sub sensitivity axis of the fourth magnetoelectric transducer may be parallel to the main sensitivity axis of the first magnetoelectric transducer and the main sensitivity axis of the second magnetoelectric transducer.

In the current sensor according to an embodiment of the invention, the sub sensitivity axes of the first to fourth magnetoelectric transducers may be parallel to a direction of flow of the current path to be measured.

In the current sensor according to an embodiment of the invention, the sensitivity direction of the main sensitivity axis of the first magnetoelectric transducer and the sensitivity direction of the main sensitivity axis of the second magnetoelectric transducer may be opposite to each other, wherein the first magnetoelectric transducer and the second magnetoelectric transducer may have the same characteristics, wherein the sensitivity direction of the main sensitivity axis of the third magnetoelectric transducer and the sensitivity direction of the main sensitivity axis of the fourth magnetoelectric transducer may be opposite to each other, and wherein the third magnetoelectric transducer and the fourth magnetoelectric transducer may have the same characteristics.

DESCRIPTION OF THE PREFERRED EMBODIMENTS

According to embodiments of the invention, in a current sensor that may eliminate the influence of a disturbance magnetic field by performing a differential process with respect to output signals of a plurality of magnetoelectric transducers, it is necessary that a magnetic field generated by a current to be measured and a neighboring current are separated in order to eliminate the influence of a magnetic field generated by the neighboring current flowing in a neighboring current path, and magnetoelectric transducers corresponding to each detection of the magnetic fields are provided. In the invention, in addition to a magnetoelectric transducer that detects the magnetic field generated by the current to be measured, a magnetoelectric transducer that selectively detects the magnetic field generated by the neighboring current is provided, and therefore, by controlling directions of sensitivity axes of the plurality of magnetoelectric transducers, the influence of the disturbance magnetic field may be reduced to thereby accurately measure a current value of a current path to be measured.

The current sensor according to an embodiment of the invention is a current sensor that eliminates the influence of the disturbance magnetic field by calculating (calculating the sum or difference of) output signals of the plurality of magnetoelectric transducers, includes a pair of signal detecting magnetoelectric transducers for detecting a magnetic field generated by a current to be measured and a pair of disturbance magnetic field detecting magnetoelectric transducers for selectively detecting a magnetic field generated by a neighboring current, and calculates values of a current flowing in a current path to be measured based on output values of the plurality of magnetoelectric transducers. More specifically, the pair of signal detecting magnetoelectric transducers has a main sensitivity axis parallel to a direction of the magnetic field generated by the current to be measured, and the directions of the corresponding magnetic fields are applied in the mutually opposite direction. In addition, the pair of disturbance magnetic field detecting magnetoelectric transducers has a main sensitivity axis orthogonal to a direction of the magnetic field generated by the current to be measured, and the directions of the corresponding magnetic fields are applied in the mutually opposite direction. By performing an arithmetic process using the output signals of the signal detecting magnetoelectric transducer and the disturbance magnetic field detecting magnetoelectric transducer, the influence of the disturbance magnetic field may be eliminated from the output signal of the signal detecting magnetoelectric transducer. Hereinafter, embodiments of the invention will be described with reference to the accompanying drawings.

First Embodiment

Figure 1:
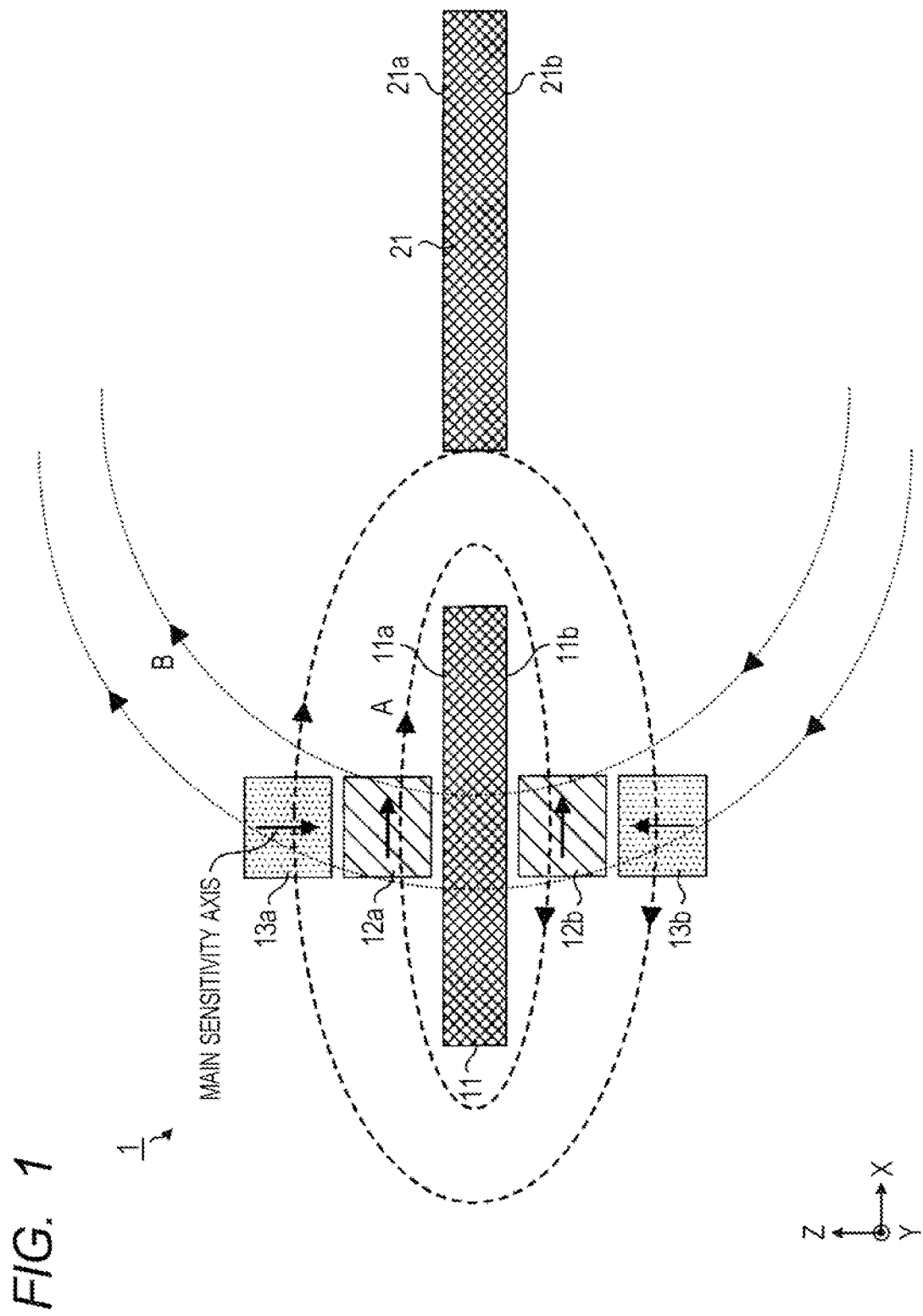
FIG. 1 is an example of a schematic cross-sectional view showing a current sensor according to a first embodiment of the invention.

In the present embodiment, an example of a current sensor of the invention will be described with reference to FIG. 1. FIG. 1 is a schematic cross-sectional view showing a current sensor 1 according to the present embodiment. In addition, the schematic cross-sectional view of the current sensor 1 corresponds to a viewpoint from a direction (Y direction) in which a current to be measured flows.

As shown in FIG. 1, the current sensor 1 includes a current path 11 to be measured, a neighboring current path 21 that is provided so as to be adjacent to the current path 11 to be measured, a pair of signal detecting magnetoelectric transducers 12a and 12b that measures a magnetic field generated by a current to be measured, and a pair of disturbance magnetic field detecting magnetoelectric transducers 13a and 13b that selectively measures a magnetic field generated by a neighboring current.

Each of the current path 11 to be measured and the neighboring current path 21 is a conductive member that extends along an arbitrary direction (extends in a front-depth direction of the paper (Y direction) in FIG. 1). In FIG. 1, there is a case in which a cross-sectional shape of each of the current path 11 to be measured and the neighboring current path 21 is a rectangular shape, but the invention is not limited thereto, and other shapes such as a circular shape, an elliptical shape, a polygonal shape, or the like may be used as the cross-sectional shape of each of the current path 11 to be measured and the neighboring current path 21. In addition, the current path 11 to be measured and the neighboring current path 21 may be provided so as to be parallel to each other.

The pair of signal detecting magnetoelectric transducers 12a and 12b (hereinafter, referred to as "a first magnetoelectric transducer 12a and a second magnetoelectric transducer 12b") are provided in such a manner that a main sensitivity axis is parallel to a direction of a magnetic field generated by the current to be measured. In addition, the first magnetoelectric transducer 12a and the second magnetoelectric transducer 12b are provided in such a manner that directions of the magnetic fields generated by the current to be measured are applied in mutually opposite directions. In addition, the main sensitivity axis indicates a direction having the highest sensitivity in the magnetoelectric transducer.

The pair of disturbance magnetic field detecting magnetoelectric transducers 13a and 13b (hereinafter, referred to as "a third magnetoelectric transducer 13a and a fourth magnetoelectric transducer 13b") are provided in such a manner that a main sensitivity axis is orthogonal to the direction of the magnetic field generated by the current to be measured, and the main sensitivity axis is non-orthogonal to a direction of the magnetic field generated by the neighboring current. In addition, the third magnetoelectric transducer 13a and the fourth magnetoelectric transducer 13b are provided in such a manner that the directions of the magnetic fields generated by the current to be measured are applied in mutually opposite directions. Consequently, the third magnetoelectric transducer 13a and the fourth magnetoelectric transducer 13b for detecting a disturbance magnetic field are provided so as to selectively detect the magnetic field generated by the neighboring current path without detecting the magnetic field generated by the current to be measured.

As the first to fourth magnetoelectric transducers 12a to 13b, an element for converting a magnetic strength into an electric variable such as a voltage, electric resistance, or the like may be used, and a magneto resistance effect element such as a giant magneto resistance (GMR) element or a tunnel magneto resistance (TMR) element, a Hall element (an element having a magnetic converging plate), and the like may be adopted.

In addition, as shown in FIG. 1, it is preferable that the current sensor 1 according to the present embodiment be provided in such a manner that the same magnitude of the magnetic field generated by the neighboring current is applied to the first magnetoelectric transducer 12a and the second magnetoelectric transducer 12b. In the same manner, it is preferable that the current sensor 1 according to the present embodiment be provided in such a manner that the same magnitude of the magnetic field generated by the neighboring current is applied to the third magnetoelectric transducer 13a and the fourth magnetoelectric transducer 13b. For example, in FIG. 1, when it is assumed that a line connecting a center of the current path 11 to be measured and a center of the neighboring current path 21 is a first imaginary line, a line connecting the first magnetoelectric transducer 12a and the second magnetoelectric transducer 12b is a second imaginary line, and a line connecting the third magnetoelectric transducer and the fourth magnetoelectric transducer is a third imaginary line, the first imaginary line and the second imaginary line may be orthogonal to each other, and the first imaginary line and the third imaginary line may be orthogonal to each other.

Figure 2:
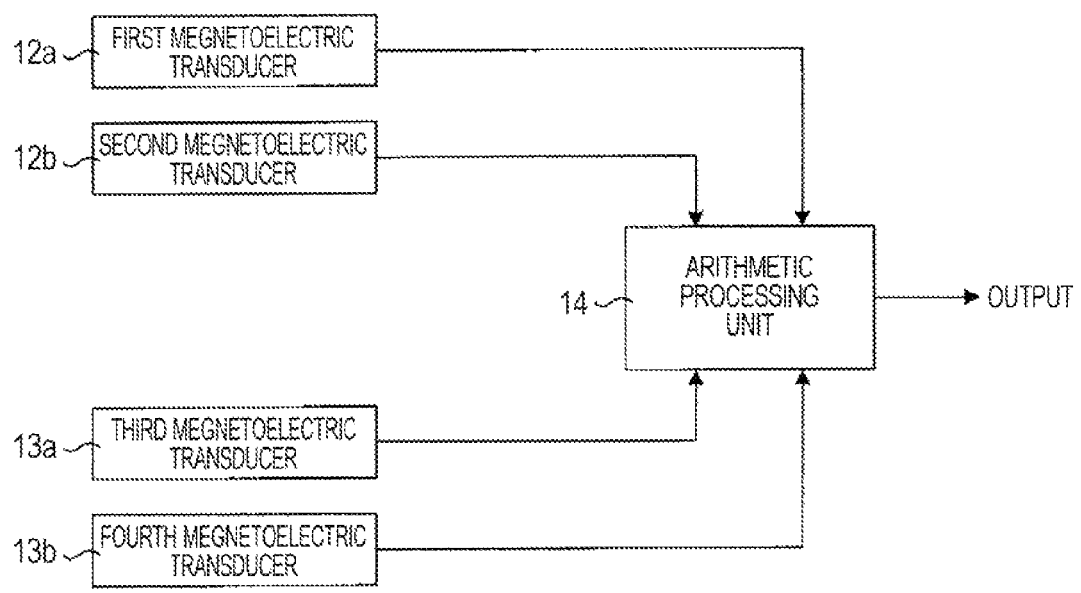
FIG. 2 is an example of a block diagram showing a current sensor according to a first embodiment of the invention.

In addition, the current sensor 1 includes an arithmetic processing unit that calculates values of the current to be measured based on outputs of the pair of signal detecting magnetoelectric transducers 12a and 12b and the pair of disturbance magnetic field detecting magnetoelectric transducers 13a and 13b. FIG. 2 is a block diagram of the current sensor 1 according to the present embodiment. As shown in FIG. 2, the current sensor 1 includes a plurality of magnetoelectric transducers (first to fourth magnetoelectric transducers 12a to 13b) and the arithmetic processing unit 14 that performs a signal processing (calculating values of the current) on output signals from the plurality of magnetoelectric transducers. In the arithmetic processing unit 14, the current path 11 to be measured and the neighboring current path 21 may be separately provided, or combined.

The arithmetic processing unit 14 performs a differential arithmetic operation on output signals of the first magnetoelectric transducer 12a and the second magnetoelectric transducer 12b. In the same manner, the arithmetic processing unit 14 performs a differential arithmetic operation on output signals of the third magnetoelectric transducer 13a and the fourth magnetoelectric transducer 13b. In values obtained by performing the differential arithmetic operation on the output signals of the first magnetoelectric transducer 12a and the second magnetoelectric transducer 12b, a component of the disturbance magnetic field generated by the neighboring current in addition to a component of the magnetic field generated by the current to be measured are included. On the other hand, in values obtained by performing the differential arithmetic operation on the output signals of the third magnetoelectric transducer 13a and the fourth magnetoelectric transducer 13b, the component of the magnetic field generated by the current to be measured is not included, and the component of the disturbance magnetic field generated by the neighboring current is selectively included. Therefore, in the arithmetic processing unit 14, the component of the disturbance magnetic field may be eliminated from the results obtained by performing the differential arithmetic operation on the output signals of the first magnetoelectric transducer 12a and the second magnetoelectric transducer 12b using the results obtained by performing the differential arithmetic operation on the output signals of the third magnetoelectric transducer 13a and the fourth magnetoelectric transducer 13b.

For example, when the strength of the magnetic field generated by the current to be measured is A, and the strength of the magnetic field generated by the neighboring current is B, the strength of the magnetic field that is detected in the pair of signal detecting magnetoelectric transducers and the pair of disturbance magnetic field detecting magnetoelectric transducers is as follows.

Figure 3:
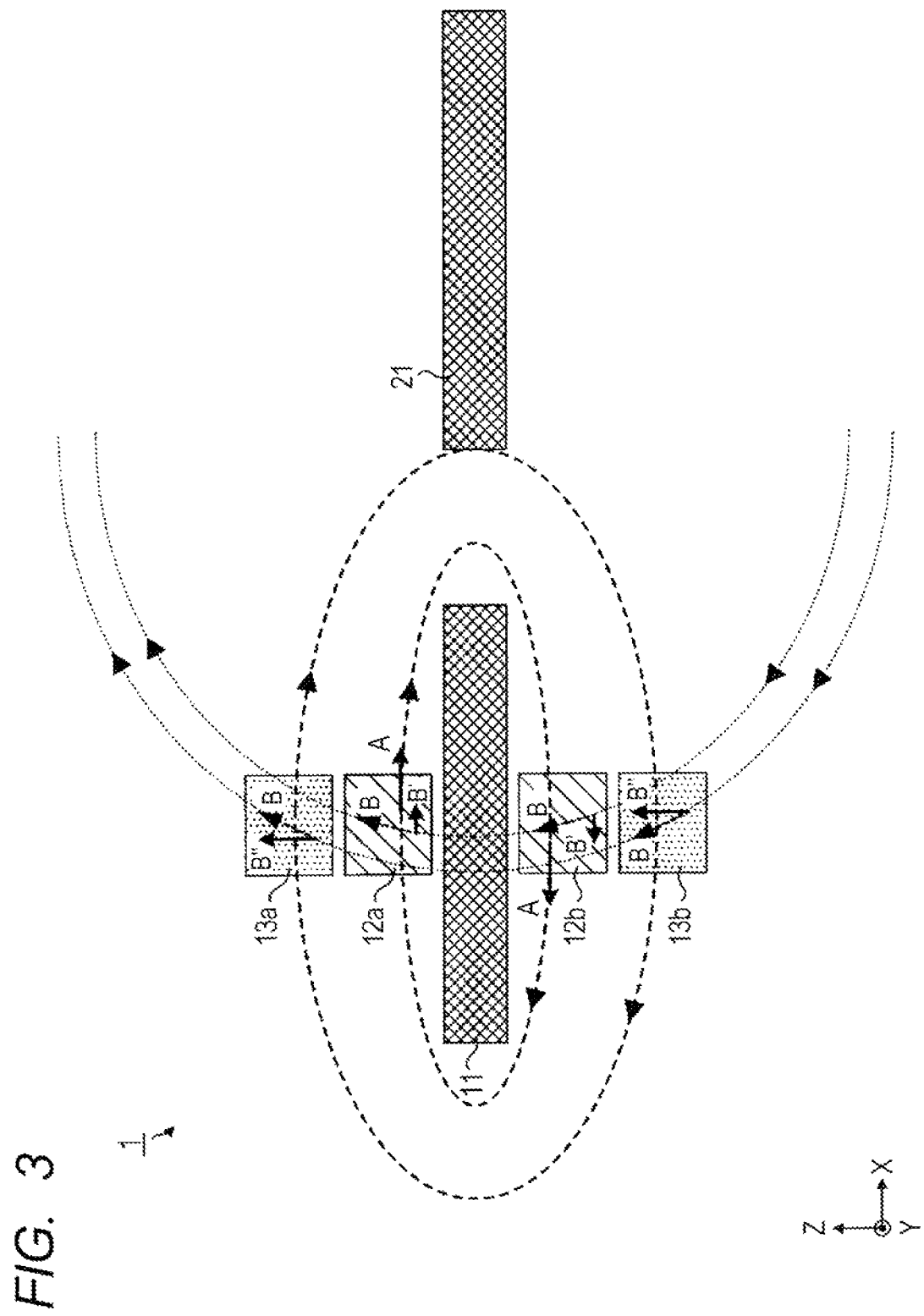
FIG. 3 is an example of a schematic cross-sectional view showing a current sensor according to a first embodiment of the invention.

When considering a difference in the pair of signal detecting magnetoelectric transducers 12a and 12b, a differential value HA1 of the magnetic field detected by the influence of the current to be measured is HA1=−A−(A)=−2A. In addition, a differential value HB1 of the magnetic field detected by the influence of the neighboring current is HB1=−B'−(B')=−2B (see FIG. 3). Accordingly, the sum H1 of the differences of the magnetic fields that are detected in the pair of signal detecting magnetoelectric transducers 12a and 12b is H1=−2A−2B'. The influence (−2B') of the magnetic field generated by the neighboring current is included in H1. In addition, B' indicates a component of an X direction of the magnetic fields generated by the neighboring current.

When considering a difference in the pair of disturbance magnetic field detecting magnetoelectric transducers 13a and 13b, a differential value HA2 of the magnetic field detected by the influence of the current to be measured is HA2=−0−0=0. In addition, a differential value HB2 of the magnetic field detected by the influence of the neighboring current is HB2=−B"−(B")=−2B (see FIG. 3). Consequently, the sum H2 of the differences of the magnetic fields that are detected in the pair of disturbance magnetic field detecting magnetoelectric transducers 13a and 13b is H2=−2B", and includes only the magnetic field (−2B") generated by the neighboring current without including the magnetic field generated by the current to be measured. In addition, B" indicates a component of a Z direction of the magnetic field generated by the neighboring current.

Accordingly, in the arithmetic processing unit 14, based on the differential arithmetic value of the output signal of the pair of signal detecting magnetoelectric transducers and the differential arithmetic value of the output signal of the pair of disturbance magnetic field detecting magnetoelectric transducers, the influence of the magnetic field generated by the neighboring current may be eliminated from the output signal of the signal detecting magnetoelectric transducers by performing the arithmetic process. For example, when the output signal of the signal detecting magnetoelectric transducer is X, and the output signal of the disturbance magnetic field detecting magnetoelectric transducer is Y, a signal output value may be obtained from X−C·Y. Here, C is a correction value obtained by considering the magnitude of the magnetic field applied in a main sensitivity axis direction of the pair of signal detecting magnetoelectric transducers from the neighboring current path and the magnitude of the magnetic field applied in a main sensitivity axis direction of the pair of disturbance magnetic field magnetoelectric transducers from the neighboring current path.

In this manner, in the current sensor 1 shown in FIG. 1, the pair of signal detecting magnetoelectric transducers 12a and 12b may accurately measure the influence received from the disturbance magnetic field generated by the neighboring current or the like using the pair of disturbance magnetic field detecting magnetoelectric transducers 13a and 13b. Therefore, by eliminating the influence of the disturbance magnetic field from the output signal of the first and second magnetoelectric transducers 12a and 12b for detecting signals, the current to be measured may be accurately measured. In addition, two signal detecting magnetoelectric transducers and two disturbance magnetic field detecting magnetoelectric transducers are respectively provided to perform a differential process, and therefore the influence of the parallel disturbance magnetic field such as earth magnetism may be effectively eliminated.

As described above, a shape of the current path 11 to be measured in the current sensor 1 according to the present embodiment is not particularly limited, but it is preferable that the shape of the current path 11 to be measured be a flat plate having a rectangular cross-sectional shape including a first long side 11a and a second long side 11b which are parallel to each other. In this case, the first magnetoelectric transducer 12a and the third magnetoelectric transducer 13a are provided on a side of the first long side 11a, and the second magnetoelectric transducer 12b and the fourth magnetoelectric transducer 13b are provided on a side of the second long side 11b. In this manner, when the current path 11 to be measured is the flat plate, a direction of a sensitivity axis of each magnetoelectric transducer and a direction of the magnetic field generated by the current to be measured are easily made parallel or orthogonal to each other, thereby improving measurement accuracy of the current to be measured.

In addition, when the current path 11 to be measured is the flat plate as described, it is preferable that the first and third magnetoelectric transducers 12a and 13a be provided in a middle portion of the first long side 11a and the second and fourth magnetoelectric transducers 12b and 13b be provided in a middle portion of the second long side 11b. When a cross-section of the current path 11 to be measured is a rectangular shape, a magnetic field of the middle portion of the current path 11 to be measured is parallel to the longest side, so that each magnetoelectric transducer is provided in the middle portion of the current path 11 to be measured, thereby effectively improving measurement accuracy.

In addition, in the current sensor 1, it is preferable that the current path 11 to be measured that is the flat plate and the neighboring current path 21 be provided on the same plane. For example, in the same manner as that in the current path 11 to be measured, the neighboring current path 21 is a flat plate having a rectangular cross-sectional shape including a third long side 21a and a fourth long side 21b which are parallel to each other, and the current path 11 to be measured and the neighboring current path 21 are provided on the same plane parallel to the first to fourth long sides 11a to 21b.

In this manner, the current path 11 to be measured and the neighboring current path 21 are formed in a flat plate, and provided on the same plane, and therefore the direction of the sensitivity axis of each magnetoelectric transducer and the direction of the magnetic field generated by the current to be measured may be easily made parallel or orthogonal to each other, and the magnetic field generated by the neighboring current may be uniformly applied to the first and second magnetoelectric transducers 12a and 12b (the third and fourth magnetoelectric transducers 13a and 13b). As a result, measurement accuracy of the current to be measured may be effectively improved.

In addition, in the current sensor 1, it is preferable that the first magnetoelectric transducer 12a and the third magnetoelectric transducer 13a be placed as close as possible, and the second magnetoelectric transducer 12b and the fourth magnetoelectric transducer 13b be placed as close as possible. More preferably, the first magnetoelectric transducer 12a and the third magnetoelectric transducer 13a may be in contact with each other, and the second magnetoelectric transducer 12b and the fourth magnetoelectric transducer 13b may be in contact with each other. The signal detecting magnetoelectric transducers and the disturbance magnetic field detecting magnetoelectric transducers are in contact with each other, so that the influence of the disturbance magnetic field applied to the signal detecting magnetoelectric transducers and the disturbance magnetic field detecting magnetoelectric transducers may be approximated, thereby simplifying the arithmetic process and improving measurement accuracy of the current to be measured.

Figure 4:
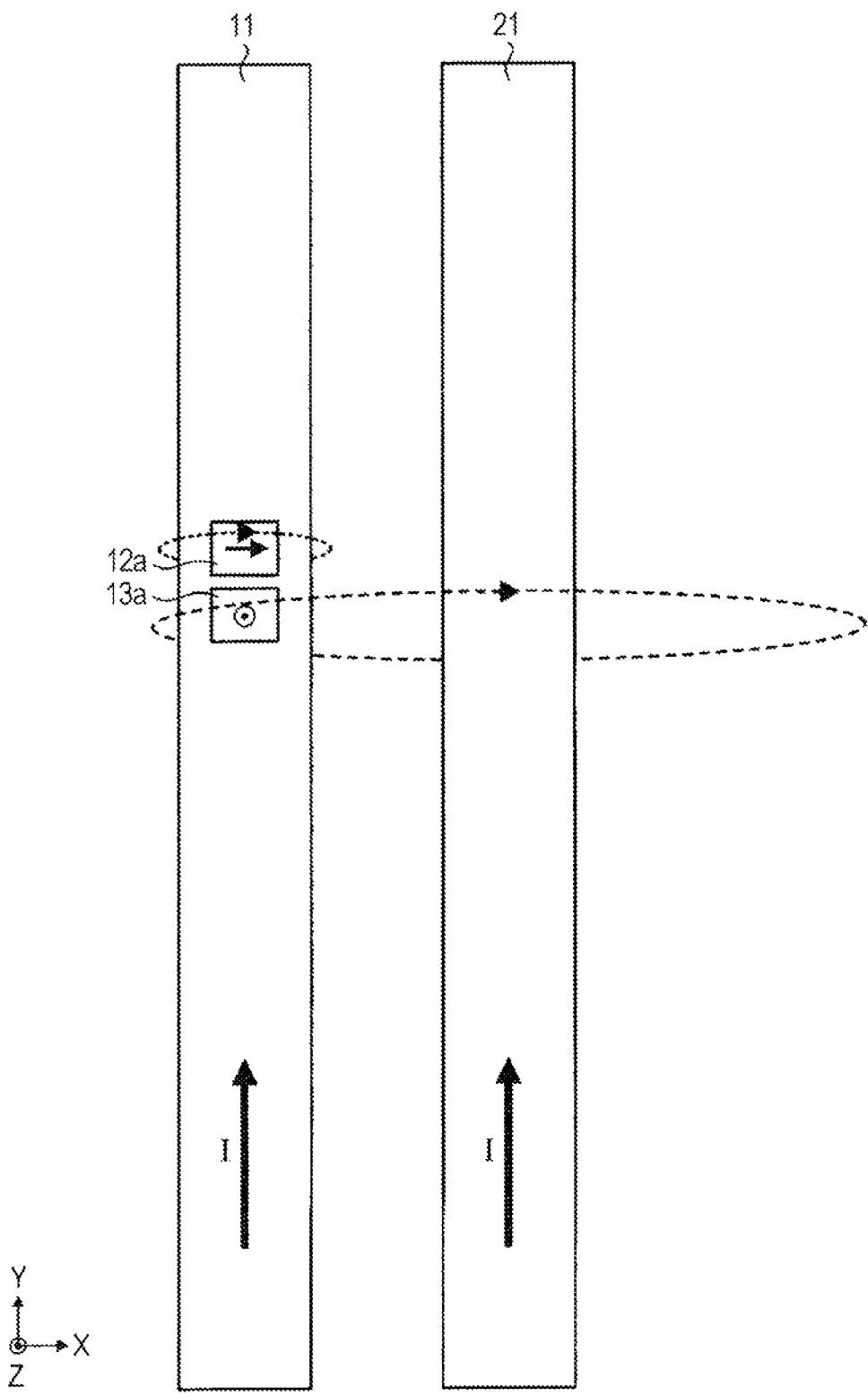
FIG. 4 is an example of a schematic top view showing a current sensor according to a first embodiment of the invention.

In addition, a positional relationship between the first magnetoelectric transducer 12a and the third magnetoelectric transducer 13a is not particularly limited. For example, as shown in FIG. 4, it is preferable that the first magnetoelectric transducer 12a and the third magnetoelectric transducer 13a be provided to be displaced in a direction of flow (Y direction) of the current to be measured. In the same manner, even with respect to a positional relationship between the second magnetoelectric transducer 12b and the fourth magnetoelectric transducer 13b, it is preferable that the second magnetoelectric transducer 12b and the fourth magnetoelectric transducer 13b be provided to be displaced in the direction of flow of the current to be measured. FIG. 4 is a schematic top view showing a current sensor 1 according to the present embodiment. In addition, the second magnetoelectric transducer 12b may be provided so as to be symmetrical with the first magnetoelectric transducer 12a through the current path 11 to be measured in a Z direction, and the fourth magnetoelectric transducer 13b may be provided so as to be symmetrical with the third magnetoelectric transducer 13a through the current path 11 to be measured in the Z direction.

In this case, the first magnetoelectric transducer 12a and the third magnetoelectric transducer 13a (the second magnetoelectric transducer 12b and the fourth magnetoelectric transducer 13b) are arranged in parallel on the current path 11 to be measured. Therefore, the influence of the magnetic field generated by the neighboring current that is exerted on the first magnetoelectric transducer 12a and the third magnetoelectric transducer 13a (the second magnetoelectric transducer 12b and the fourth magnetoelectric transducer 13b) may have the same magnitude.

Obviously, the invention is not limited thereto, and the first magnetoelectric transducer 12a and the third magnetoelectric transducer 13a may be disposed in a vertical direction (see FIG. 1) in the schematic cross-sectional view, or may be arranged in parallel on the current path 11 to be measured, along a direction (X direction) orthogonal to the direction of the current to be measured.

Figure 5:
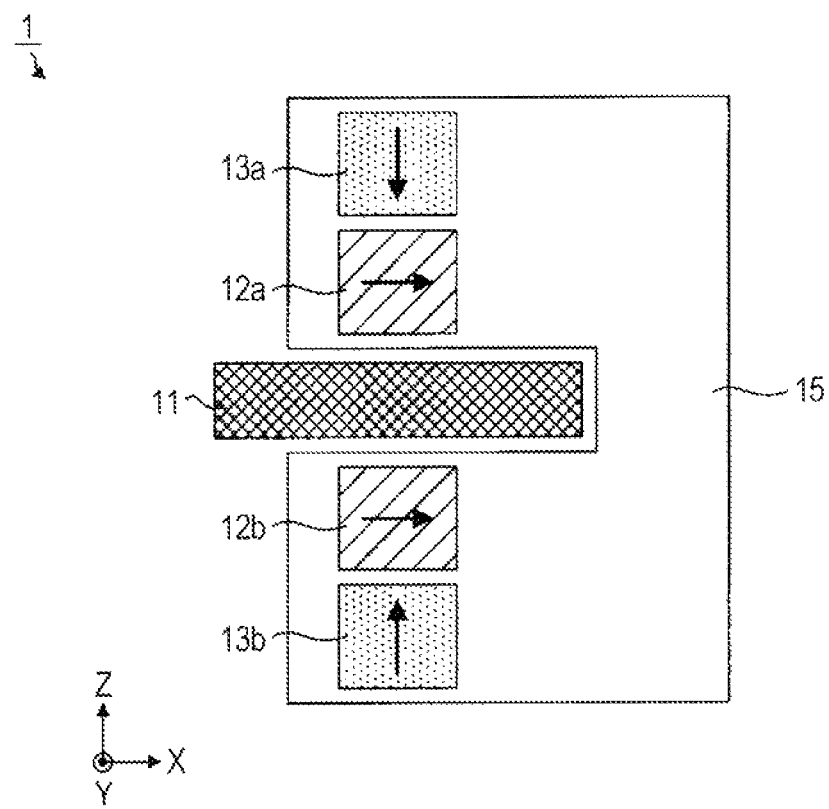
FIG. 5 is a schematic view showing a substrate on which a magnetoelectric transducer is formed.

In addition, any positional relationship between the first to fourth magnetoelectric transducers 12a to 13b may be possible as long as the main sensitivity axis is disposed in the above-described direction. For example, as shown in FIG. 5, the first to fourth magnetoelectric transducers 12a to 13b may be formed on the same substrate 15. Obviously, the invention is not limited thereto, and a configuration in which the first magnetoelectric transducer 12a and the third magnetoelectric transducer 13a which are positioned on the current path 11 to be measured are formed above a first substrate, the second magnetoelectric transducer 12b and the fourth magnetoelectric transducer 13b which are positioned below the current path 11 to be measured are formed on a second substrate different from the first substrate, and each substrate is disposed may be used.

In addition, it is preferable that the first and second magnetoelectric transducer 12a and 12b for detecting signals have the same characteristics. In the same manner, it is preferable that the third and fourth magnetoelectric transducers 13a and 13b for detecting the disturbance magnetic field have the same characteristics. Since the first and second magnetoelectric transducer 12a and 12b for detecting signals (the third and fourth magnetoelectric transducers 13a and 13b for detecting the disturbance magnetic field) is a pair for the differential process, it is possible to simplify the arithmetic process by enabling the characteristics of the magnetoelectric transducers to be made the same.

In addition, the first and third magnetoelectric transducers 12a and 13a (the second and fourth magnetoelectric transducers 12b and 13b) may have the same characteristics. In particular, when the magnetic field with approximately the same magnitude is applied to the first and third magnetoelectric transducers 12a and 13a (the second and fourth magnetoelectric transducers 12b and 13b), it is possible to simplify the arithmetic process by enabling the characteristics of the magnetoelectric transducers to be made the same.

Second Embodiment

There is a case in which the magnetoelectric transducer among the magnetoelectric transducers has an axis (sensitivity influence axis) that affects detection sensitivity even in a direction orthogonal to the main sensitivity axis having the highest sensitivity. As examples of the sensitivity influence axis, a direction (a sub sensitivity axis) having the highest sensitivity among directions orthogonal to the main sensitivity axis and an application direction (a sensitivity change axis) of a magnetic field applied in a direction orthogonal to the main sensitivity axis in order to change the sensitivity may be given. For example, when using a CMR element as the magnetoelectric transducer, the sensitivity in the sub sensitivity axis may be about several tens of % of the sensitivity in the main sensitivity axis. Therefore, in the current sensor, when using the magnetoelectric transducer having the sub sensitivity axis or the like in the direction orthogonal to the main sensitivity axis, it is desirable to determine a disposition relationship between the plurality of magnetoelectric transducers considering even the direction of the sub sensitivity axis.

Figure 6:
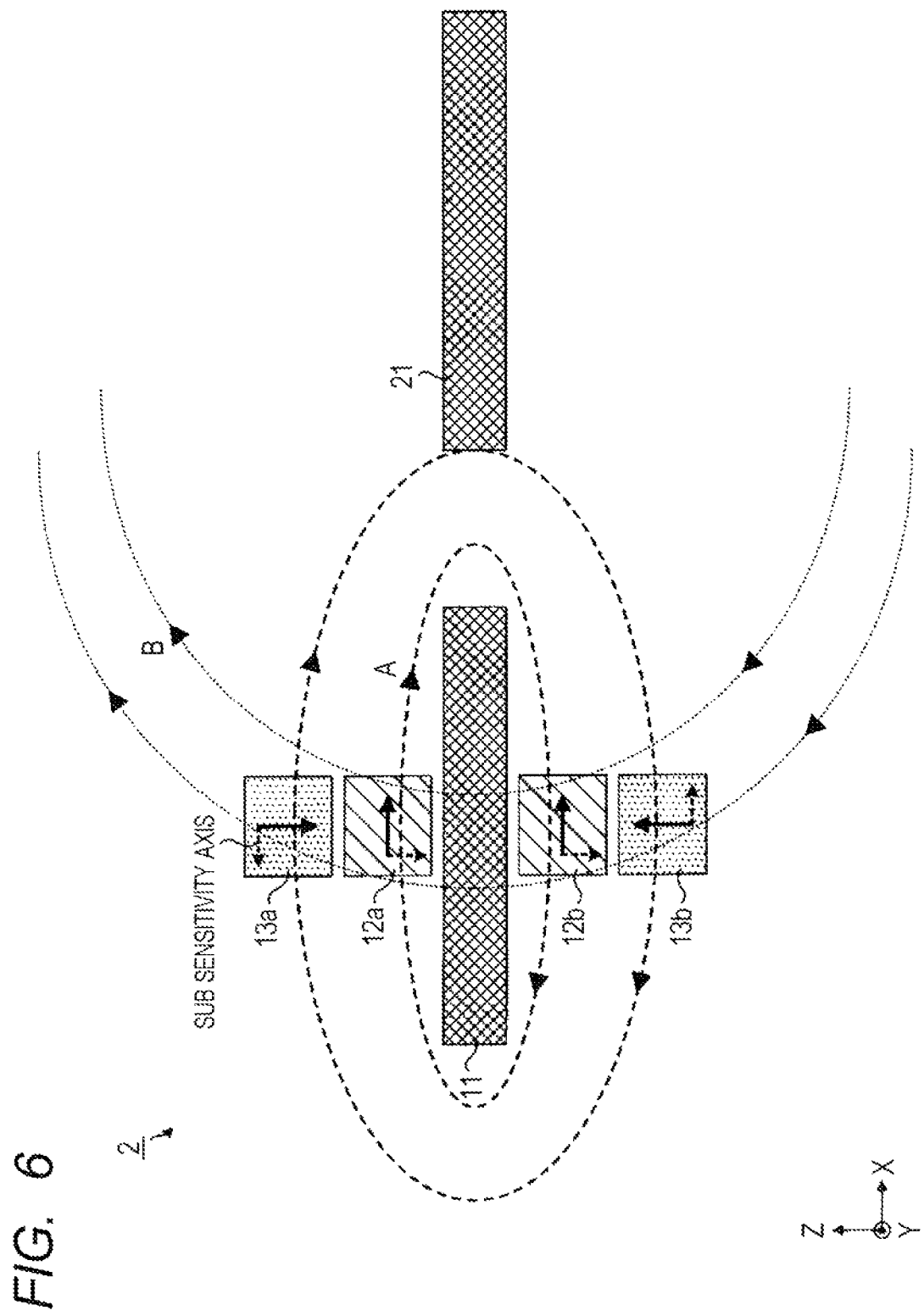
FIG. 6 is an example of a schematic cross-sectional view showing a current sensor according to a second embodiment of the present invention.

In the present embodiment, as an example of the current sensor according to an embodiment of the invention, the current sensor having the sub sensitivity axis in addition to the main sensitivity axis will be described with reference to FIG. 6. FIG. 6 is a schematic cross-sectional view showing a current sensor 2 according to the present embodiment.

The current sensor 2 shown in FIG. 6 includes a current path 11 to be measured, a neighboring current path 21, a pair of signal detecting magnetoelectric transducers 12a and 12b that measures a magnetic field generated by a current to be measured, and a pair of disturbance magnetic field detecting magnetoelectric transducers 13a and 13b that selectively measures a disturbance magnetic field generated by a neighboring current or the like.

In the same manner as that of the first embodiment, the first and second magnetoelectric transducers 12a and 12b have a main sensitivity axis parallel to a direction of the magnetic field generated by the current to be measured, and are provided in such a manner that directions of the magnetic fields generated by the current to be measured are applied in mutually opposite directions. In addition, the third and fourth magnetoelectric transducers 13a and 13b have a main sensitivity axis which is non-orthogonal to a direction of a magnetic field generated by the neighboring current while being orthogonal to the direction of the magnetic field generated by the current to be measured, and are provided in such a manner that the directions of the magnetic fields generated by the current to be measured are applied in mutually opposite directions.

In addition, in the current sensor 2 according to the present embodiment, the first to fourth magnetoelectric transducers 12a to 13b have a sub sensitivity axis. In this case, it is preferable that sensitivity directions of the sub sensitivity axes of the first and second magnetoelectric transducers 12a and 12b be made parallel to each other and the same direction, and sensitivity directions of the sub sensitivity axes of the third and fourth magnetoelectric transducers 13a and 13b be made parallel to each other and opposite to each other. Therefore, it is possible to cancel the influence of the sub sensitivity axis by the differential process.

In addition, it is preferable that the sub sensitivity axes of the first and second magnetoelectric transducers 12a and 12b be made parallel to the main sensitivity axes of the third and fourth magnetoelectric transducers 13a and 13b, and the sub sensitivity axes of the third and fourth magnetoelectric transducers 13a and 13b be made parallel to the main sensitivity axes of the first and second magnetoelectric transducers 12a and 12b.

Figure 7:
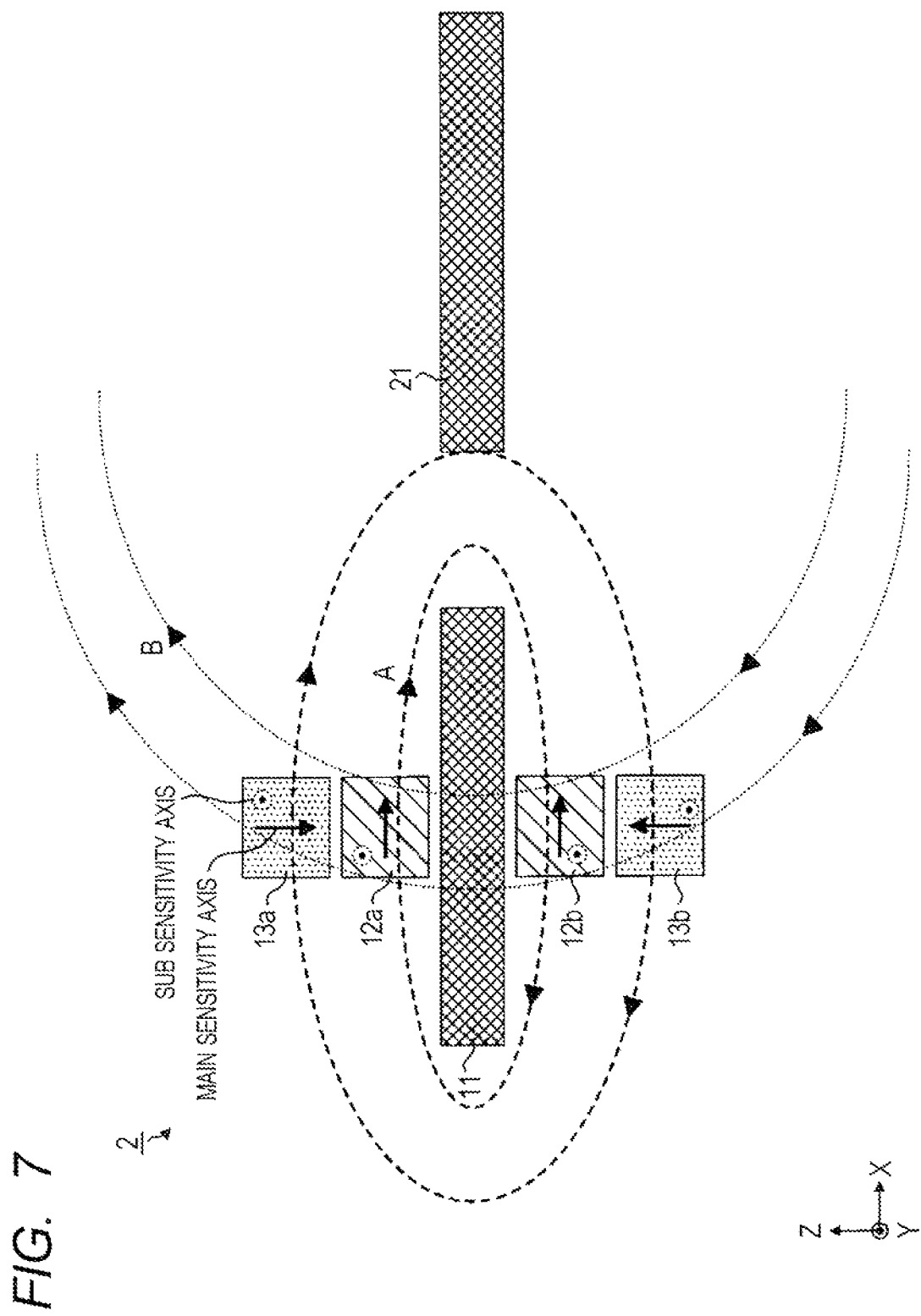
FIG. 7 is an example of a schematic cross-sectional view showing a current sensor according to a second embodiment of the invention.

In addition, it is preferable that the sub sensitivity axes of the first to fourth magnetoelectric transducers 12a to 13b be made parallel to the direction of flow (the Y direction) of the current path 11 to be measured (see FIG. 7). Therefore, a configuration in which the sub sensitivity axes of the magnetoelectric transducers are not affected by a magnetic field generated by a current flowing in the current path 11 to be measured and the neighboring current path 21 may be adopted, thereby improving measurement accuracy.

In addition, the sensitivity directions of the main sensitivity axes of the first and second magnetoelectric transducers 12a and 12b may be opposite to each other, and the first and second magnetoelectric transducers 12a and 12b have the same characteristics. In the same manner, the sensitivity directions of the main sensitivity axes of the third and fourth magnetoelectric transducers 13a and 13b may be opposite to each other, and the third and fourth magnetoelectric transducers 13a and 13b have the same characteristics. Therefore, it is possible to simplify the arithmetic process and to improve measurement accuracy. In addition, the magnetoelectric transducers having the same structure may be applied as the plurality of magnetoelectric transducers by changing a disposition direction.

In this manner, the magnetoelectric transducers are disposed considering the sensitivity direction of the sub sensitivity axis in addition to the main sensitivity axis, and therefore measurement accuracy of the current to be measured may be improved even when the magnetoelectric transducers have the sub sensitivity axes.

In addition, the invention is not limited to the above-described embodiments, and various modifications may be carried out. For example, the above-described first and second embodiments may be appropriately combined and implemented. In addition, disposition, size, or the like of each component in the above-described embodiments may be appropriately changed and implemented. In addition, the invention may be appropriately changed and carried out without departing from the scope of the invention.

The current sensor according embodiments of the invention may be used in order to measure the magnitude of the current for driving a motor of an electric vehicle or a hybrid car.

It should be understood by those skilled in the art that various modifications, combinations, sub-combinations and alterations may occur depending on design requirements and other factors insofar as they are within the scope of the appended claims of the equivalents thereof.

What is claimed is:

1. A current sensor comprising:
    a measurement current path configured to flow a measurement current therethrough;
    a neighboring current path provided in a vicinity of the measurement current path, and configured to flow a neighboring current therethrough;
    a first magnetoelectric transducer having a first main sensitivity axis and provided on a first side of the measurement current path, the first main sensitivity axis being oriented in parallel to and in a same direction as a direction of a magnetic field applied from the measurement current;
    a second magnetoelectric transducer having a second main sensitivity axis and provided on a second side of the measurement current path, the second main sensitivity axis being oriented in parallel and opposite to a direction of the magnetic field applied from the measurement current;
    a third magnetoelectric transducer having a third main sensitivity axis and provided on the first side of the measurement current path, the third main sensitivity axis being oriented orthogonal to a direction of the magnetic field applied from the measurement current, and non-orthogonal to a direction of a magnetic field applied from the neighboring current; and
    a fourth magnetoelectric transducer having a fourth main sensitivity axis and provided on the second side of the measurement current path, the fourth main sensitivity axis being oriented orthogonal to a direction of the magnetic field applied from the measurement current, and non-orthogonal to a direction of the magnetic field applied from the neighboring current.

2. The current sensor according to claim 1, wherein the first magnetoelectric transducer and the second magnetoelectric transducer are disposed in such a manner that the magnetic field applied thereto from the neighboring current has substantially a same intensity, and the third magnetoelectric transducer and the fourth magnetoelectric transducer are disposed in such a manner that the magnetic field applied thereto from the neighboring current has substantially a same intensity.

3. The current sensor according to claim 1, further comprising:
    an arithmetic processing unit configured to perform an arithmetic process based on output signals of the first, the second, the third, and the fourth magnetoelectric transducers,
    wherein the arithmetic processing unit calculates a first differential arithmetic value by performing a differential arithmetic operation on the output signals of the first magnetoelectric transducer and the second magnetoelectric transducer, calculates a second differential arithmetic value by performing a differential arithmetic operation on the output signals of the third magnetoelectric transducer and the fourth magnetoelectric transducer, and calculates the measurement current based on the first differential arithmetic value and the second differential arithmetic value.

4. The current sensor according to claim 1, wherein the measurement current path is in a form of a flat plate with a rectangular cross-section having a first long side and a second long side parallel to each other, and
    wherein the first magnetoelectric transducer and the third magnetoelectric transducer are provided on the first side corresponding to the first long side, and the second magnetoelectric transducer and the fourth magnetoelectric transducer are provided on the second side corresponding to the second long side.

5. The current sensor according to claim 4, wherein the first magnetoelectric transducer and the third magnetoelectric transducer are provided adjacent to a middle portion of the first long side, and the second magnetoelectric transducer and the fourth magnetoelectric transducer are provided adjacent to a middle portion of the second long side.

6. The current sensor according to claim 1,
wherein the measurement current path is in a form of a flat plate with a rectangular cross-section having first long side and a second long side parallel to each other,
wherein the neighboring current path is in a form of a flat plate with a rectangular cross-section having a third long side and a fourth long side parallel to each other, and
wherein the measurement current path and the neighboring current path are provided on a same plane parallel to the first long side, the second long side, the third long side, and the fourth long side.

7. The current sensor according to claim 1, wherein the first magnetoelectric transducer and the third magnetoelectric transducer are in contact with each other, and the second magnetoelectric transducer and the fourth magnetoelectric transducer are in contact with each other.

8. The current sensor according to claim 1, wherein the first magnetoelectric transducer and the third magnetoelectric transducer are displaced along a direction of flow of the measurement current, and the second magnetoelectric transducer and the fourth magnetoelectric transducer are displaced along the direction of flow of the measurement current.

9. The current sensor according to claim 1, wherein the first magnetoelectric transducer through the fourth magnetoelectric transducer have substantially same characteristics.

10. The current sensor according to claim 1, wherein the first, second, third, and fourth magnetoelectric transducers have a respective sub sensitivity axis having a highest sensitivity in a direction orthogonal to the first, second, third, and fourth main sensitivity axes, respectively, and
wherein the sub sensitivity axis of the first magnetoelectric transducer and the sub sensitivity axis of the second magnetoelectric transducer are oriented in a same direction, and the sub sensitivity axis of the second magnetoelectric transducer and the sub sensitivity axis of the fourth magnetoelectric transducer are oriented in opposite directions.

11. The current sensor according to claim 10, wherein the sub sensitivity axis of the first magnetoelectric transducer and the sub sensitivity axis of the second magnetoelectric transducer are parallel to the third main sensitivity axis and the fourth main sensitivity axis, and
wherein the sub sensitivity axis of the third magnetoelectric transducer and the sub sensitivity axis of the fourth magnetoelectric transducer are parallel to the first main sensitivity axis and the second main sensitivity axis.

12. The current sensor according to claim 10, wherein the sub sensitivity axes of the first, second, third, and fourth magnetoelectric transducers are parallel to a direction of flow of the measurement current path.

13. The current sensor according to claim 10, wherein the sensitivity direction of the first main sensitivity axis and the sensitivity direction of the second main sensitivity axis are opposite to each other, wherein the first magnetoelectric transducer and the second magnetoelectric transducer have the same characteristics, wherein the sensitivity direction of the third main sensitivity axis and the sensitivity direction of the fourth main sensitivity axis are opposite to each other, and wherein the third magnetoelectric transducer and the fourth magnetoelectric transducer have substantially same characteristics.

14. The current sensor according to claim 1, wherein a direction of the magnetic field applied from the measurement current to the third magnetoelectric transducer and a direction of the magnetic field applied from the measurement current to the fourth magnetoelectric transducer are opposite to each other.

15. The current sensor according to claim 1, wherein the magnetic field generated by the measurement current has a first direction on the first side of the measurement current path and a second direction opposite to the first direction on the second side of the measurement current path.

* * * * *